(12) United States Patent
Garcia

(10) Patent No.: US 12,101,078 B2
(45) Date of Patent: *Sep. 24, 2024

(54) TRANSVERSELY-EXCITED FILM BULK ACOUSTIC RESONATORS USING MULTIPLE DIELECTRIC LAYER THICKNESSES TO SUPPRESS SPURIOUS MODES

(71) Applicant: Murata Manufacturing Co., Ltd.

(72) Inventor: Bryant Garcia, Mississauga (CA)

(73) Assignee: Murata Manufacturing Co., Ltd., Nagaokakyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/304,875

(22) Filed: Apr. 21, 2023

(65) Prior Publication Data

US 2023/0253948 A1 Aug. 10, 2023

Related U.S. Application Data

(63) Continuation of application No. 17/093,257, filed on Nov. 9, 2020, now Pat. No. 11,671,070.
(Continued)

(51) Int. Cl.
*H03H 9/02* (2006.01)
*H03H 9/205* (2006.01)
*H03H 9/56* (2006.01)

(52) U.S. Cl.
CPC .... *H03H 9/02157* (2013.01); *H03H 9/02228* (2013.01); *H03H 9/205* (2013.01); *H03H 9/568* (2013.01); *H03H 2009/02173* (2013.01)

(58) Field of Classification Search
CPC .......... H03H 9/02157; H03H 9/02228; H03H 9/205; H03H 9/568; H03H 2009/02173; H03H 2003/0442; H03H 9/174
(Continued)

(56) References Cited

U.S. PATENT DOCUMENTS 5,705,399 A 1/1998 Larue
5,853,601 A 12/1998 Krishaswamy et al.
(Continued)

FOREIGN PATENT DOCUMENTS

WO 2016017104 2/2016
WO 2018003273 A1 1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Rakesh B Patel
*Assistant Examiner* — Jorge L Salazar, Jr.
(74) *Attorney, Agent, or Firm* — ArentFox Schiff LLP

(57) ABSTRACT

Acoustic filters and methods of fabricating acoustic filters are disclosed. A filter includes a single-crystal piezoelectric plate having a front surface and a back surface attached to a substrate, and a plurality of acoustic resonators including a first shunt resonator, a second shunt resonator, and one or more series resonators. Each of the plurality of acoustic resonators includes an interdigital transducer (IDT) formed on the front surface of the piezoelectric plate, interleaved fingers of the IDT disposed on a respective diaphragm formed by a portion of the piezoelectric plate that spans a cavity in the substrate. A frequency setting dielectric layer is formed over the first and second shunt resonators but not over the one or more series resonators. The frequency setting dielectric layer has a thickness t1 on the first shunt resonator and a thickness t2 on the second shunt resonator, where t1 is not equal to t2.

20 Claims, 8 Drawing Sheets

Related U.S. Application Data

(60) Provisional application No. 63/067,327, filed on Aug. 19, 2020.

(58) Field of Classification Search
USPC .................................................. 333/193–196
See application file for complete search history.

(56) References Cited

U.S. PATENT DOCUMENTS

| | | | |
|---|---|---|---|
| 6,540,827 B1 | 4/2003 | Levy et al. | |
| 6,707,229 B1 | 3/2004 | Martin | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 11,671,070 B2 * | 6/2023 | Garcia | H03H 9/02228 333/187 |
| 2002/3007998 | 6/2002 | Ruby et al. | |
| 2002/0158714 A1 | 10/2002 | Kaitila et al. | |
| 2003/0199105 A1 | 10/2003 | Kub et al. | |
| 2004/0261250 A1 | 12/2004 | Kadota et al. | |
| 2006/0125489 A1 | 6/2006 | Feucht et al. | |
| 2006/0222568 A1 | 10/2006 | Wang et al. | |
| 2007/0194863 A1 | 8/2007 | Shibata et al. | |
| 2010/0064492 A1 | 3/2010 | Tanaka | |
| 2010/0123367 A1 | 5/2010 | Tai et al. | |
| 2011/0109196 A1 | 5/2011 | Goto | |
| 2011/0278993 A1 | 11/2011 | Iwamoto | |
| 2013/0015353 A1 | 1/2013 | Tai et al. | |
| 2013/0234805 A1 | 9/2013 | Takahashi | |
| 2013/0321100 A1 | 12/2013 | Wang | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0370791 A1 | 12/2017 | Nakamura et al. | |
| 2018/0123016 A1 | 5/2018 | Gong et al. | |
| 2018/0191322 A1 | 7/2018 | Chang et al. | |
| 2019/0068164 A1 | 2/2019 | Houlden et al. | |
| 2019/0131953 A1 | 5/2019 | Gong | |
| 2019/0273480 A1 | 9/2019 | Lin | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

TRANSVERSELY-EXCITED FILM BULK ACOUSTIC RESONATORS USING MULTIPLE DIELECTRIC LAYER THICKNESSES TO SUPPRESS SPURIOUS MODES

CROSS REFERENCE TO RELATED APPLICATIONS

This application is a continuation of U.S. patent application Ser. No. 17/093,257, filed Nov. 9, 2020, which claims priority to U.S. Provisional Patent Application No. 63/067,327, filed Aug. 19, 2020, the entire contents of each are which are hereby incorporated by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

The Transversely-Excited Film Bulk Acoustic Resonator (XBAR) is a resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
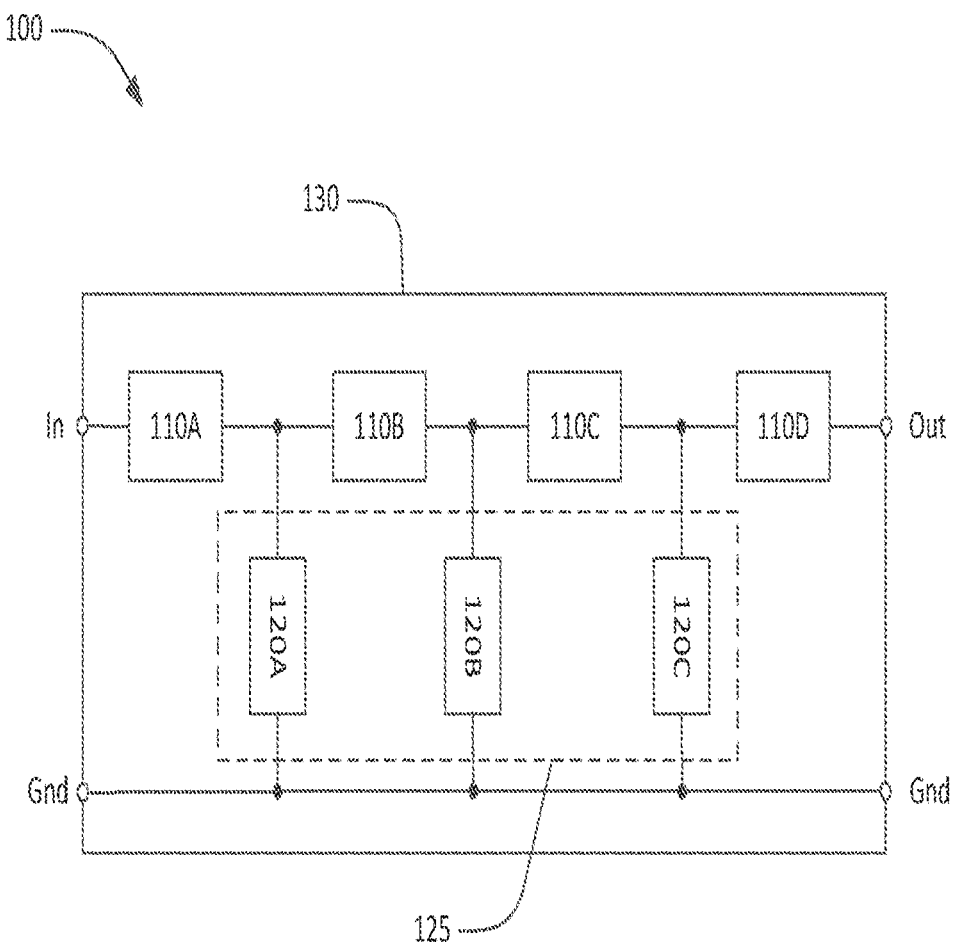
FIG. 1 is a schematic block diagram of a filter using transversely-excited film bulk acoustic resonator (XBARs).

FIG. 1 is a schematic block diagram of a high frequency band-pass filter 100 using XBARs. The filter 100 has a conventional ladder filter architecture including four series resonators 110A, 110B, 110C, 110D and three shunt resonators 120A, 120B, 120C. The series resonators 110A, 110B, 110C, and 110D are connected in series between a first port and a second port (hence the term "series resonator"). In FIG. 1, the first and second ports are labeled "In" and "Out", respectively. However, the filter 100 is bidirectional and either port may serve as the input or output of the filter. The shunt resonators 120A, 120B, 120C are connected from nodes between the series resonators to ground. A filter may contain additional reactive components, such as inductors, not shown in FIG. 1. All the shunt resonators and series resonators are XBARs. The inclusion of four series and three shunt resonators is exemplary. A filter may have more or fewer than seven total resonators, more or fewer than four series resonators, and more or fewer than three shunt resonators. Typically, all of the series resonators are connected in series between an input and an output of the filter. All of the shunt resonators are typically connected between ground and the input, the output, or a node between two series resonators.

In the exemplary filter 100, the series resonators 110A, B, C, D and the shunt resonators 120A, B, D of the filter 100 are formed on a single plate 130 of piezoelectric material bonded to a silicon substrate (not visible). Each resonator includes a respective IDT (not shown), with at least the fingers of the IDT disposed over a cavity (not shown) in the substrate. In this and similar contexts, the term "respective" means "relating things each to each", which is to say with a one-to-one correspondence.

Each of the resonators 110A, 110B, 110C, 110D, 120A, 120B, 120C in the filter 100 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 100. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

The resonance frequency of an XBAR is primarily determined by the thickness of its diaphragm. The resonance frequency also has a slight dependence on the pitch (center-to-center spacing) and mark (line width) of interleaved fingers of its IDT. For a broad bandwidth filter, the required difference between the resonance frequencies of the shunt resonator and the resonance frequencies of the series resonators is too great to be achieved by changing IDT pitch and mark. To achieve the necessary frequency difference, a dielectric frequency setting layer is formed over the IDTs of the shunt resonators. The dielectric frequency setting layer, represented by the dashed rectangle 125, increases the thickness of the diaphragms of the shunt resonators. This lowers the resonance frequencies of the shunt resonators relative to the resonance frequencies of the series resonators.

Figure 2:
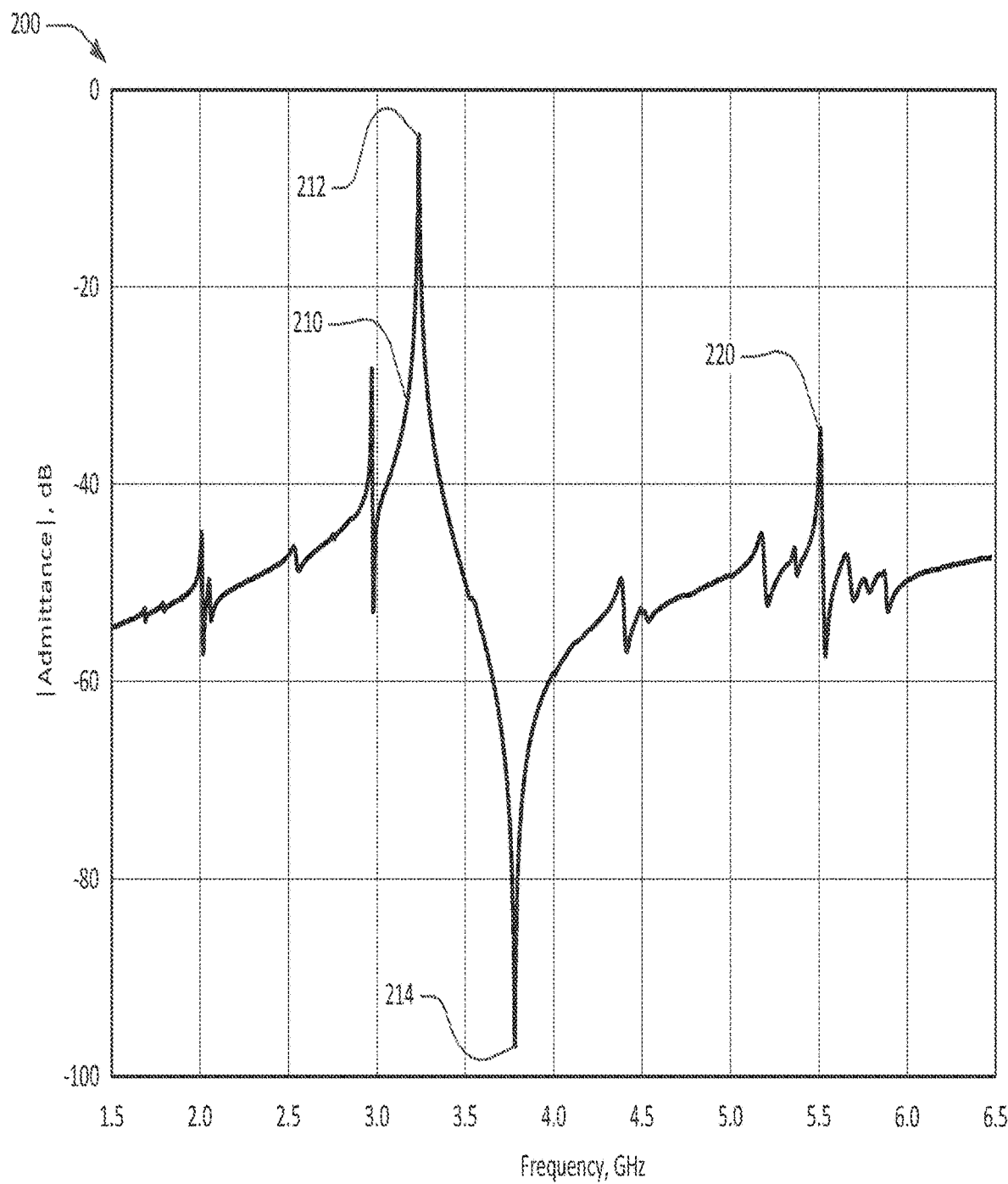
FIG. 2 is a graph of the magnitude of admittance for an XBAR with a thick frequency setting dielectric layer.

XBAR bandpass filters for wide communications bands, such as band n77, require a thick frequency setting dielectric layer on shunt resonators to establish sufficient frequency separation between shunt and series resonators. The resulting asymmetric structure allows efficient excitation of spurious acoustic modes. FIG. 2 is a graph 200 of the performance of an XBAR with a thick frequency setting dielectric layer. This XBAR is suitable for use as one of the shunt resonators 120A, 120B, and 120C in the filter circuit shown in FIG. 1. Specifically, the curve 210 is a plot of the magnitude of admittance of the XBAR as a function of frequency. The XBAR has a lithium niobate piezoelectric plate 484 nm thick and a top-side $SiO_2$ frequency setting layer 161 nm thick, or 33% of the thickness of the piezoelectric plate. FIG. 2 and subsequent graphs are based on simulations of XBARs using a finite element method.

The XBAR has a resonance 212 where its admittance is maximum at a resonance frequency of 3.23 GHz. The XBAR has an anti-resonance 214 where its admittance is minimum at an anti-resonance frequency of 3.77 GHz. An A2 spurious mode 220 occurs at 5.5 GHz. The strong excitation of the A2 mode is due in large part to the asymmetric structure of the XBAR. Excitation of the A2 spurious mode may become significant when the thickness of the frequency setting dielectric layer equals or exceeds about 25% of the thickness of the piezoelectric plate.

The frequency of the A2 spurious mode 220 is determined primarily by the total thickness (piezoelectric plate plus frequency setting dielectric layer). The frequency of the A2 spurious mode has little dependence on other parameters such as IDT pitch and mark. Thus, the A2 spurious modes of all of the shunt resonators in a filter will occur at approximately the same frequency.

Figure 3:
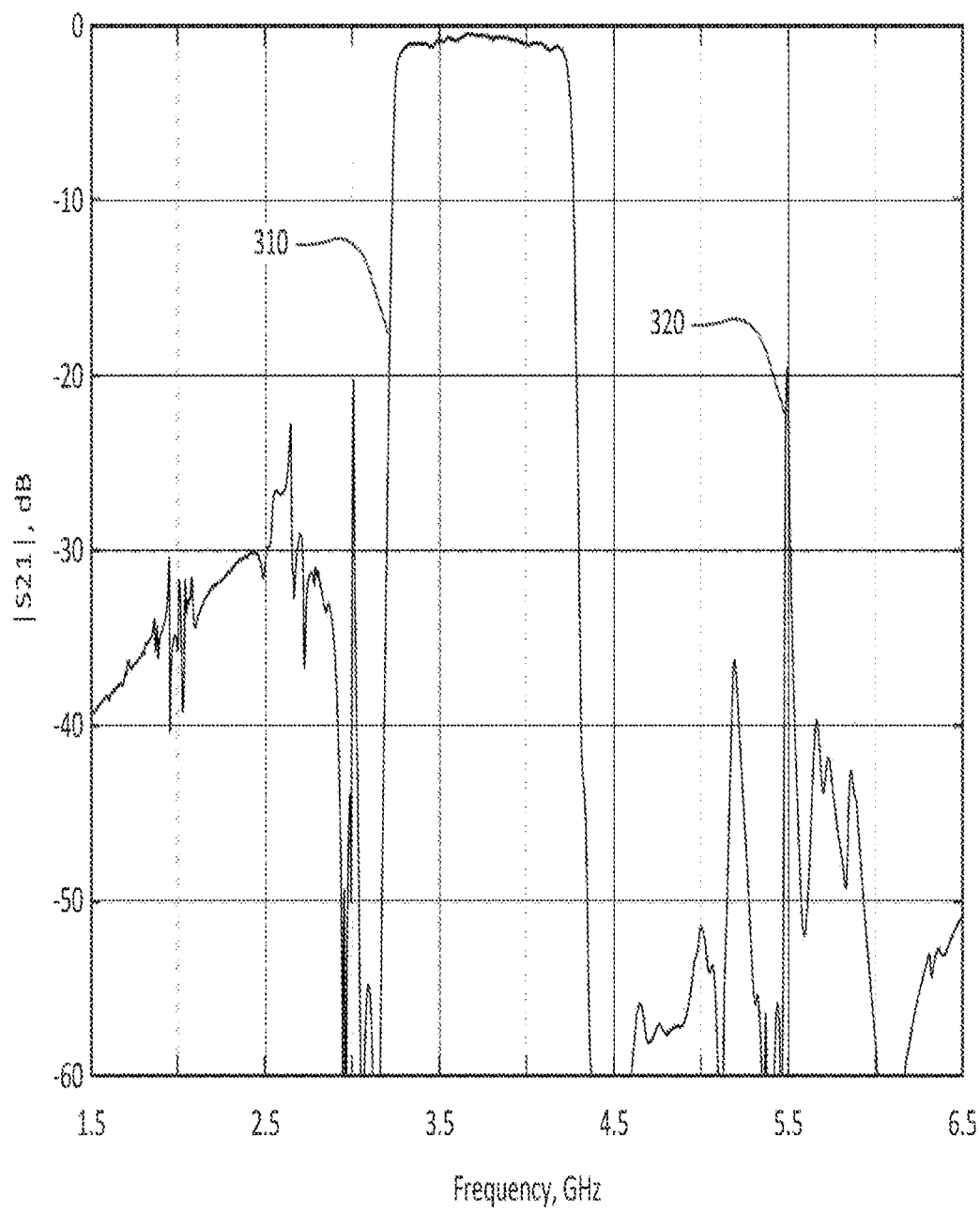
FIG. 3 is a graph of the input/output transfer function of a filter with a common frequency setting dielectric layer thickness on all shunt resonators.

FIG. 3 is graph of the performance of a broad-band bandpass filter using XBARs. Specifically, the solid curve 310 is a plot of the magnitude of S12, the input-output transfer function of the filter including three shunt resonators and four series resonators connected in a ladder filter circuit as shown in FIG. 1. The large spike 320 about 5.5 GHZ is the cumulative effect of the A2 spurious modes of the three shunt resonators in this filter. All of these shunt resonators have the same frequency setting dielectric layer thickness (33% of the piezoelectric plate thickness) as the resonator of FIG. 2. This filter has requirements on the maximum allowable value of S21 over the frequency range from 4.5 to 6.5 GHz. These requirements cannot be satisfied at 5.5 GHz due the effects of the A2 spurious modes in the shunt resonators (i.e. the spike 320).

Figure 4:
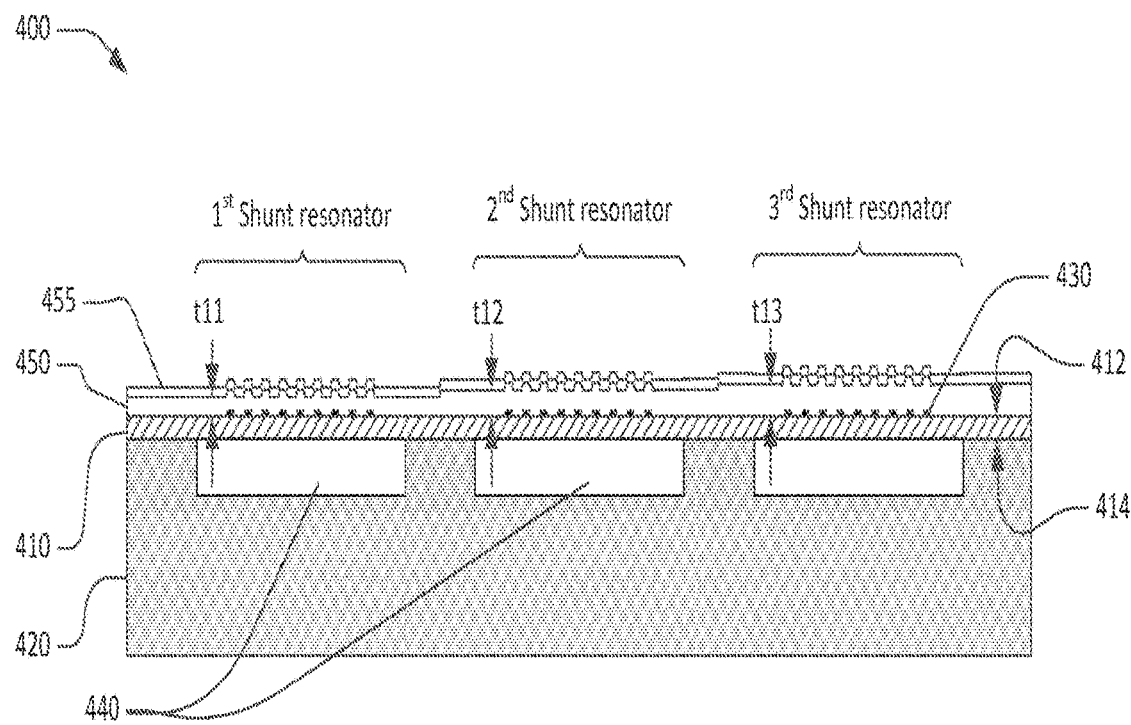
FIG. 4 is a schematic cross-sectional view of a portion of a filter with different frequency setting dielectric layer thicknesses on three shunt resonators.

FIG. 4 is a schematic cross-section view of a portion of a filter 400 with multiple frequency setting dielectric layer thicknesses. FIG. 4 shows first, second, and third shunt resonators. Each shunt resonator includes a portion of a piezoelectric plate 410 with a front surface 412 and a back surface 414. The back surface 414 is attached to a substrate 420. Portions of the piezoelectric plate 410 form diaphragms spanning cavities 440 in the substrate 420. Each of the first, second, and third shunt resonators includes a respective IDT with interleaved fingers of the IDT, such as IDT finger 430, disposed on the respective diaphragm. A frequency setting dielectric layer 450 covers the IDT fingers and the front surfaces of the diaphragms of the shunt resonators.

The frequency setting dielectric layer has a first thickness t11 over the first shunt resonator, a second thickness t12 over the second shunt resonator and a third thickness t13 over the third shunt resonator, where t11≠t12≠t13. In filters with less than or more than three shunt resonators, the thickness of the frequency setting dielectric layer over any one of the shunt resonators may be different from the thickness of the frequency setting dielectric layer over all other shunt resonators. This may be expressed as $t1i \neq t1j$, where i and j are integers from 1 to n, where n is the number of shunt resonators in a filter, and $i \neq j$.

Using different frequency setting dielectric layer thicknesses on the shunt resonators places the A2 mode of each shunt resonator at a slightly different frequency than the A2 modes of all other shunt resonators. This prevents the constructive addition of the A2 modes that results in the admittance spike 320 seen in FIG. 3.

A second dielectric layer 455 may be deposited over both the shunt and series resonator. The second dielectric layer 455 serves to seal and passivate the surface of the filter 400. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 400. Thus, the second dielectric layer can be referred to as the "passivation and tuning layer".

Figure 5:
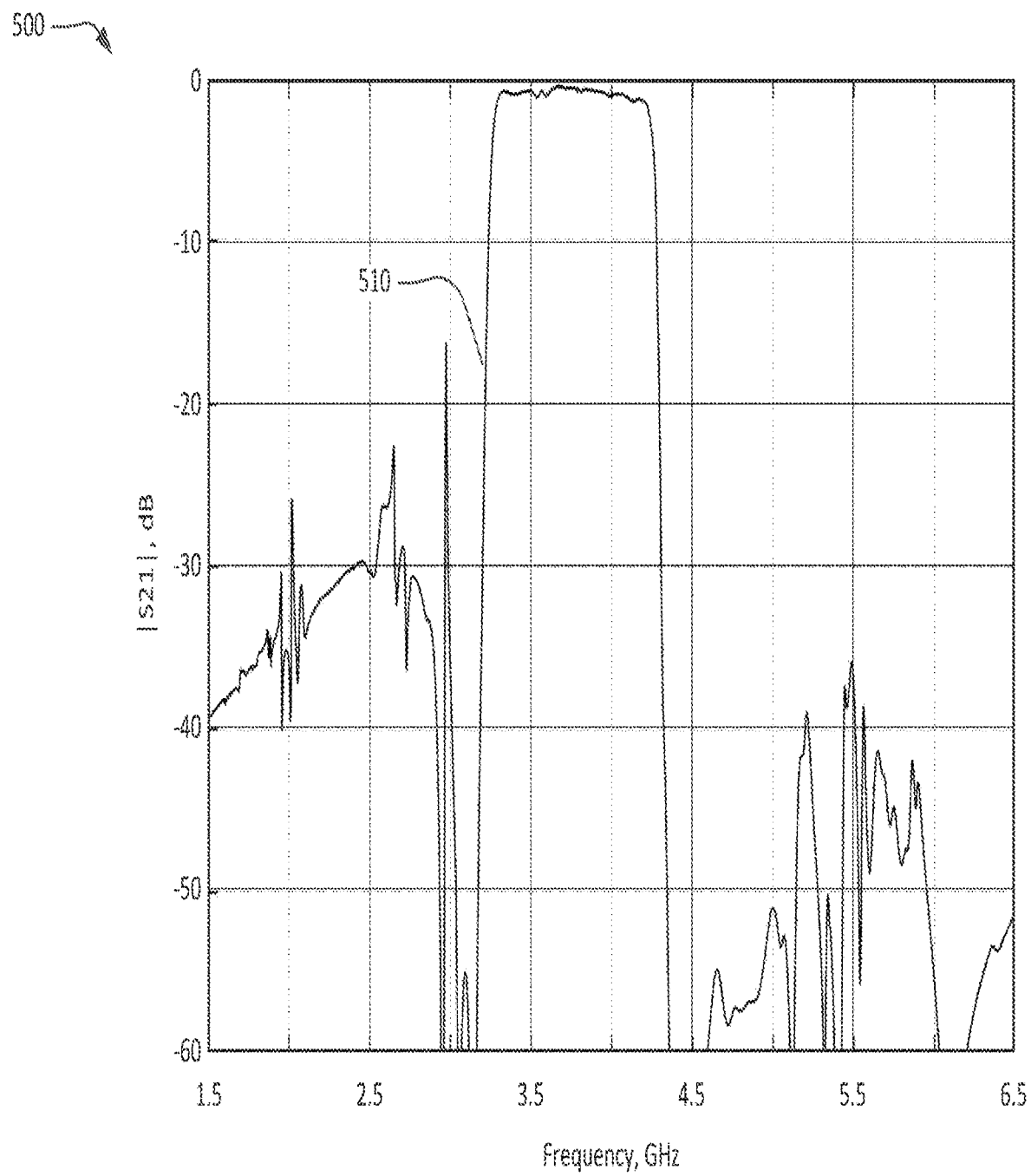
FIG. 5 is a graph of the input/output transfer function of a filter with different frequency setting dielectric layer thicknesses.

FIG. 5 is graph 500 of the performance of a broad-band bandpass filter using XBARS with multiple frequency setting dielectric layer thicknesses. Specifically, the solid curve 510 is a plot of the magnitude of S12, the input-output transfer function of a filter that is identical to the filter of FIG. 3 except for the multiple frequency setting dielectric layer thicknesses. The first, second, and third frequency setting dielectric layer thickness are 31.8%, 33.3%, and 34.3%, respectively, of the thickness of the piezoelectric plate used in the filter. The large admittance spike about 5.5 GHz seen in FIG. 3 does not exist.

The differences between the thicknesses of the first, second, and third frequency setting dielectric layers in the example are typical. In a filter with multiple shunt resonators, the thickness of the frequency setting dielectric layer over any shunt resonator will differ from the thickness of the frequency setting dielectric layer over every other shunt resonator by at least 0.5% of the piezoelectric plate thickness. In a filter with n shunt resonators, where n is an integer greater than or equal to 2, the different between the thickest and thinnest frequency setting dielectric layer formed over shunt resonators will not exceed 2(n−1)% of the piezoelectric plate thickness. For example, in a filter with two shunt resonators, the thickness of the frequency setting dielectric layer over the first shunt resonator will differ from the thickness of the frequency setting dielectric layer over the second shunt resonator by at least 0.5% and not more than 2.0% of the piezoelectric plate thickness.

Figure 6:
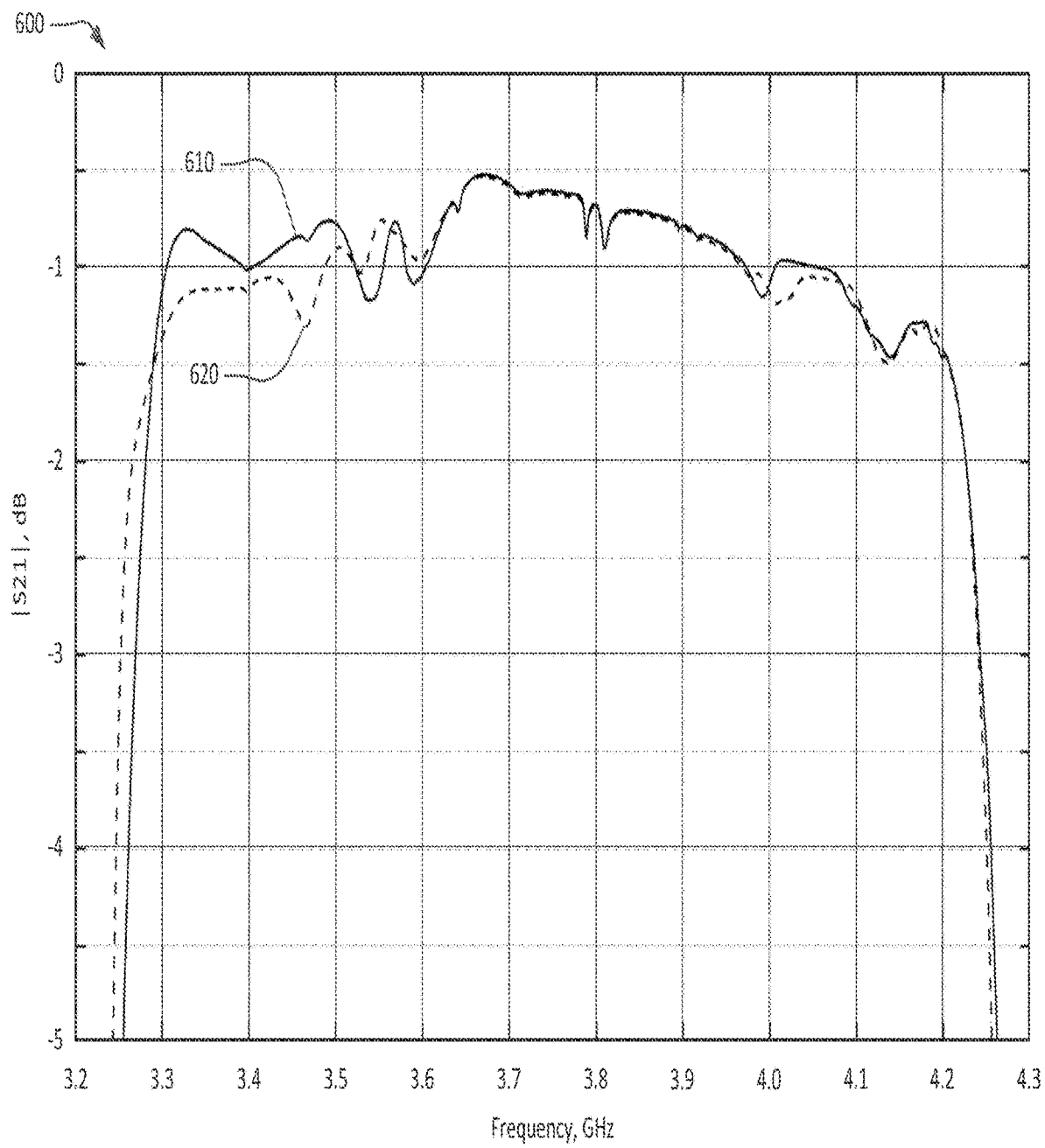
FIG. 6 is a graph comparing the performance of a filter with multiple thickness frequency setting dielectric layers and the performance of a filter with uniform thickness frequency setting dielectric layers.

FIG. 6 is graph 600 comparing the performance of a filter with multiple frequency setting dielectric layers and the performance of a filter with uniform thickness frequency setting dielectric layers. The solid line 610 is an expanded portion of the chart 500 of FIG. 5 showing the magnitude of S21 for a filter with multiple frequency setting dielectric layer thicknesses. The dashed line 620 is an expanded portion of the chart 300 of FIG. 3 showing the magnitude of S21 for a filter with uniform frequency setting dielectric layer thickness. Incorporating multiple frequency setting dielectric layer thicknesses has little effect in the passband of the filter. A slight reduction in bandwidth is evident for S21=−3 dB. The original filter bandwidth can likely be recovered by re-optimizing the mark and pitch of the shunt resonators.

Figure 7:
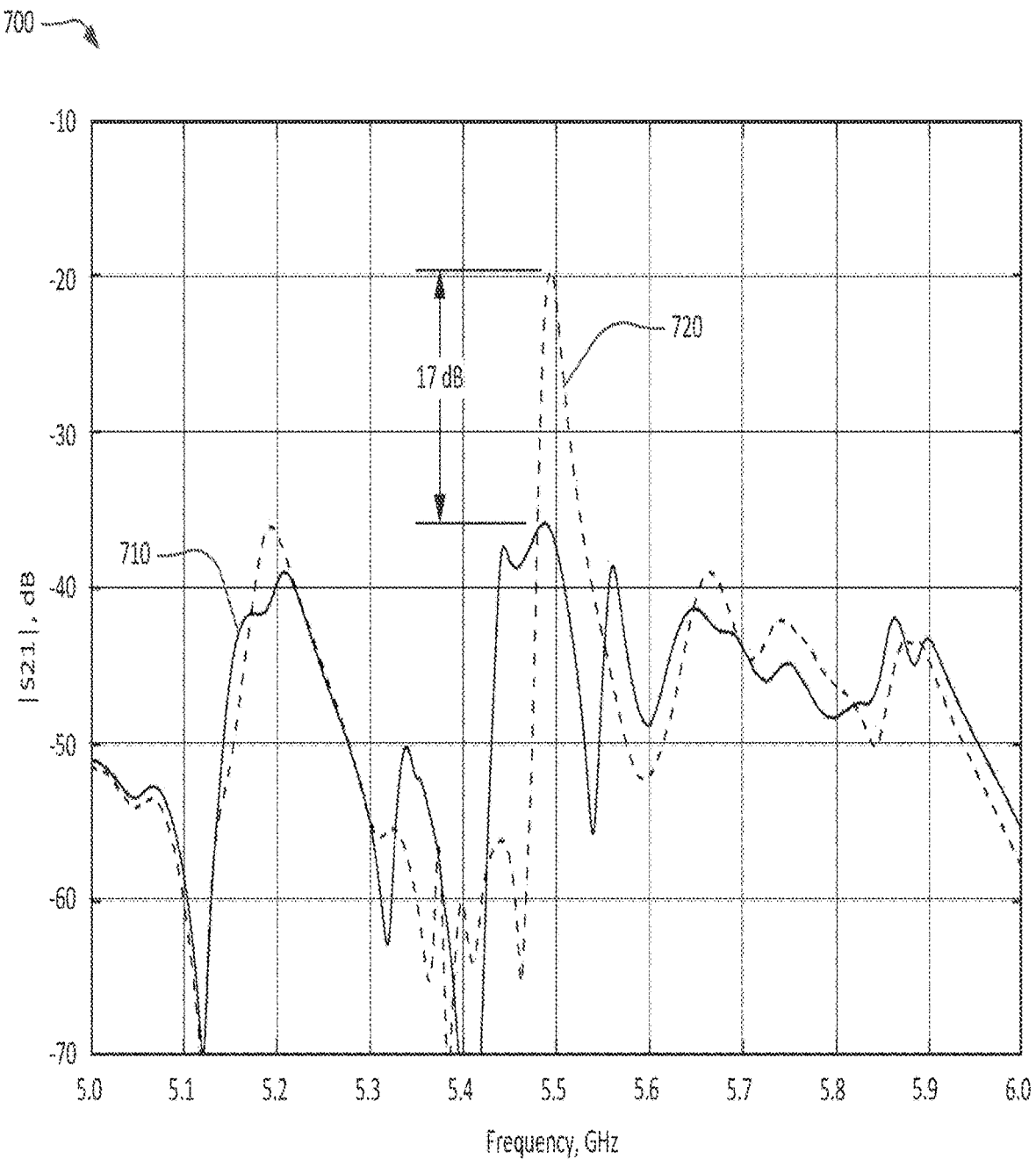
FIG. 7 is another graph comparing the performance of a filter with multiple thickness frequency setting dielectric layers and the performance of a filter with uniform thickness frequency setting dielectric layers.

FIG. 7 is another graph 700 comparing the performance of a filter with multiple frequency setting dielectric layers and the performance of a filter with uniform thickness frequency setting dielectric layers. The solid line 710 is an expanded portion of the chart 500 of FIG. 5 showing the magnitude of S21 for a filter with multiple frequency setting dielectric layer thicknesses. The dashed line 720 is an expanded portion of the chart 300 of FIG. 3 showing the magnitude of S21 for a filter with uniform frequency setting dielectric layer thickness. Incorporating multiple frequency setting dielectric layer thicknesses reduces the admittance spike at 5.5 GHz by over 17 dB.

Description of Methods

Figure 8:
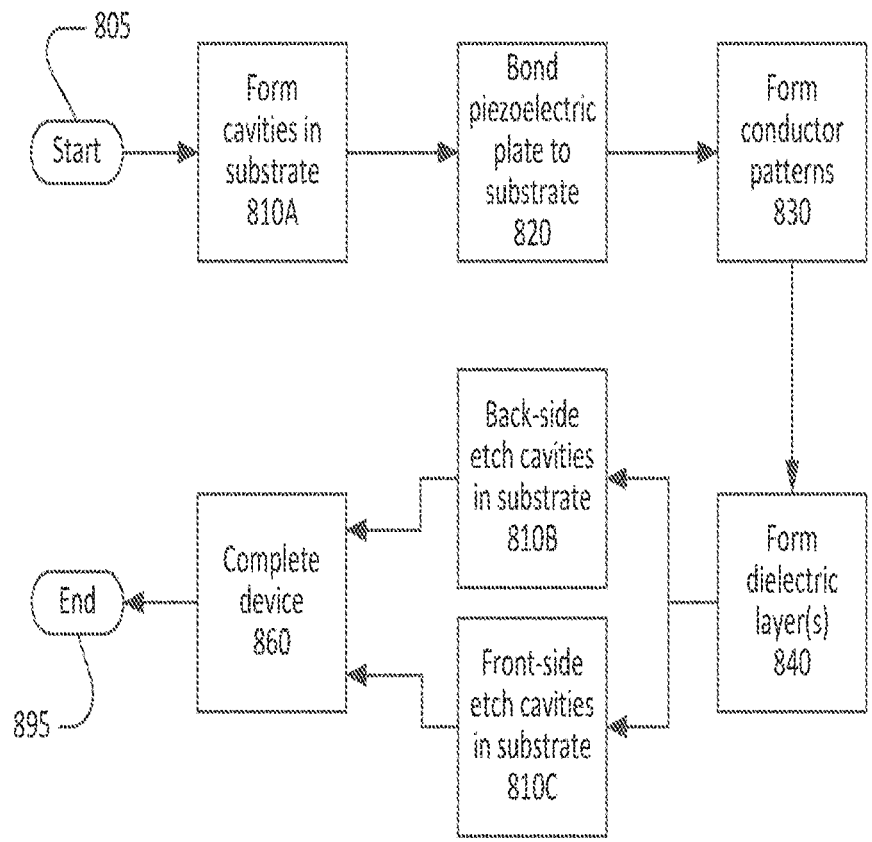
FIG. 8 is a flow chart of a process for fabricating XBARs.

FIG. 8 is a simplified flow chart showing a process 800 for making an XBAR or a filter incorporating XBARs. The process 800 starts at 805 with a substrate and a plate of piezoelectric material and ends at 895 with a completed XBAR or filter. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

The flow chart of FIG. 8 captures three variations of the process 800 for making an XBAR which differ in when and how cavities are formed in the substrate. The cavities may be formed at steps 810A, 810B, or 810C. Only one of these steps is performed in each of the three variations of the process 800.

The piezoelectric plate may be lithium niobate or lithium tantalate. The piezoelectric plate may be Z-cut, rotated Z-cut, or rotated YX-cut, or some other cut. The substrate may preferably be silicon. The substrate may be some other material that allows formation of deep cavities by etching or other processing.

In one variation of the process 800, one or more cavities are formed in the substrate at 810A, before the piezoelectric plate is bonded to the substrate at 820. A separate cavity may be formed for each resonator in a filter device. The one or more cavities may be formed using conventional photolithographic and etching techniques. Typically, the cavities formed at 810A will not penetrate through the substrate, and the resulting resonator devices will have a cross-section as shown in FIG. 4.

At 820, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 830 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 830 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 830 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

1. At 840, a front-side dielectric layer or frequency setting dielectric layer may be formed by depositing one or more layers of dielectric material on the front side of the piezoelectric plate. The frequency setting dielectric layer may be silicon dioxide, silicon nitride, aluminum oxide, aluminum nitride, beryllium oxide, tantalum oxide, tungsten oxide, or some other dielectric material.

The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of a frequency setting dielectric layer on different portions of the piezoelectric plate corresponding to different shunt resonators.

Alternatively, a uniform thickness frequency setting dielectric layer may be formed over all shunt resonators. Subsequently, material me be selectively removed from shunt resonators to provide multiple frequency setting dielectric layer thicknesses. Material may be removed, for example using masked etching or using a selective material removal tool such as a scanning ion mill.

In a second variation of the process 800, one or more cavities are formed in the back side of the substrate at 810B. A separate cavity may be formed for each resonator in a filter device. The one or more cavities may be formed using an anisotropic or orientation-dependent dry or wet etch to open holes through the back-side of the substrate to the piezoelectric plate.

In a third variation of the process 800, one or more cavities in the form of recesses in the substrate may be formed at 810C by etching the substrate using an etchant introduced through openings in the piezoelectric plate. A separate cavity may be formed for each resonator in a filter device. The one or more cavities formed at 810C will not penetrate through the substrate, and the resulting resonator devices will have a cross-section as shown in FIG. 4.

In all variations of the process 800, the filter device is completed at 860. Actions that may occur at 860 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 860 is to tune the resonant frequencies of the resonators within the device by adding or removing metal or dielectric material from the front side of the device. This tuning may also include selectively removing material from shunt resonators to create multiple frequency setting dielectric layer thicknesses. After the filter device is completed, the process ends at 895.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A filter device comprising:
a plurality of acoustic resonators including a first shunt resonator, a second shunt resonator, and one or more series resonators, each of the plurality of acoustic resonators including:
a substrate,
a piezoelectric plate supported by the substrate, and
an interdigital transducer (IDT) at the piezoelectric plate and having interleaved fingers at a diaphragm formed by a portion of the piezoelectric plate that is over a cavity;
wherein at least one frequency setting dielectric layer is at each of the first and second shunt resonators,
wherein the at least one frequency setting dielectric layer has a thickness t1 on the first shunt resonator and a thickness t2 on the second shunt resonator, where t1 is not equal to t2, and
wherein the respective thicknesses of the frequency setting dielectric layer are measured in a direction perpendicular to a surface of the respective piezoelectric plate.

2. The filter device of claim 1, wherein the at least one frequency setting dielectric layer is not over the one or more series resonators.

3. The filter device of claim 1, wherein a magnitude of a difference between t1 and t2 is greater than or equal to 0.5% of a thickness of the respective piezoelectric plates of the first and second shunt resonators and less than or equal to 2% of the thickness of the respective piezoelectric plates of the first and second shunt resonators.

4. The filter device of claim 1, wherein t1 and t2 are both greater than or equal to 25% of a thickness of the respective piezoelectric plates of the first and second shunt resonators.

5. The filter device of claim 1, wherein the at least one frequency setting dielectric layer comprises at least one of silicon dioxide, silicon nitride, aluminum oxide, aluminum nitride, beryllium oxide, tantalum oxide, and tungsten oxide.

6. The filter device of claim 1, wherein the piezoelectric plate and the IDT of each of the plurality of acoustic resonators are configured such that a respective radio frequency signal applied to each IDT excites a respective shear primary acoustic mode in the respective diaphragm.

7. The filter device of claim 1, wherein:
the plurality of acoustic resonators comprises n shunt resonators including the first and second shunt resonators, where n is an integer greater than or equal to two, and
a respective thickness of the at least one frequency setting dielectric layer over each of the n shunt resonators is different from thicknesses of the frequency setting dielectric layer over all other shunt resonators.

8. A filter device, comprising:
a plurality of acoustic resonators including n shunt resonators, where n is an integer greater than one, and one or more series resonator connected in a ladder filter circuit, each of the plurality of acoustic resonators including:
a substrate,
a piezoelectric plate supported by the substrate, and
an interdigital transducer (IDT) on the at the piezoelectric plate and having interleaved fingers on a diaphragm formed by a portion of the piezoelectric plate that is over a cavity,
wherein at least one frequency setting dielectric layer is at each of the n shunt resonators, and
wherein a thickness of the at least one frequency setting dielectric layer over any one of the n shunt resonators is different from thicknesses of the frequency setting dielectric layer over all of the other n shunt resonators.

9. The filter device of claim 8, wherein the at least one frequency setting dielectric layer is not over the one or more series resonators.

10. The filter device of claim 8, wherein a magnitude of a difference between a thickness of the at least one frequency setting dielectric layer over any one of the n shunt resonators and a thickness of the frequency setting dielectric layer over any other of the n shunt resonators is greater than or equal to 0.5% of a thickness of the piezoelectric plate of the n shunt resonators.

11. The filter device of claim 8, wherein a difference between a thickest frequency setting dielectric layer and a thinnest frequency setting dielectric layer over respective shunt resonators of the n shunt resonators is less than or equal to 2(n−1)% of a thickness of the piezoelectric plate of the n shunt resonators.

12. The filter device of claim 8, wherein respective thicknesses of the at least one frequency setting dielectric layer over all of the n shunt resonators are greater than or equal to 25% of a thickness of the piezoelectric plate of the n shunt resonators.

13. The filter device of claim 8, wherein the at least one frequency setting dielectric layer comprises at least one of silicon dioxide, silicon nitride, aluminum oxide, aluminum nitride, beryllium oxide, tantalum oxide, and tungsten oxide.

14. The filter device of claim 8, wherein the piezoelectric plate and the IDT of each of the plurality of acoustic resonators are configured such that a respective radio frequency signal applied to each IDT excites a respective shear primary acoustic mode in the respective diaphragm.

15. A filter device, comprising:
a plurality of acoustic resonators including n shunt resonators, where n is an integer greater than one, and one or more series resonator connected in a ladder filter circuit, each of the plurality of acoustic resonators including:
a substrate,
a piezoelectric plate supported by the substrate, and
an interdigital transducer (IDT) at the piezoelectric plate and having interleaved fingers on a diaphragm formed by a portion of the piezoelectric plate over a cavity;
wherein at least one frequency setting dielectric layer is at the n shunt resonators, and
wherein a thickness of the at least one frequency setting dielectric layer between the interleaved fingers of any one of the n shunt resonators is different from thicknesses of the at least one frequency setting dielectric layer between the interleaved fingers of all other resonators of the n shunt resonators.

16. The filter device of claim 15, wherein a magnitude of a difference between a thickness of the at least one frequency setting dielectric layer over any one of the n shunt resonators and a thickness of the at least one frequency setting dielectric layer over any other of the n shunt resonators is greater than or equal to 0.5% of a thickness of the piezoelectric plate of the n shunt resonators.

17. The filter device of claim 15, wherein a difference between a thickest frequency setting dielectric layer and a thinnest frequency setting dielectric layer over respective shunt resonators of the n shunt resonators is less than or equal to 2(n−1)% of a thickness of the piezoelectric plate of the n shunt resonators.

18. The filter device of claim 15, wherein respective thicknesses of the at least one frequency setting dielectric layer over all of the n shunt resonators are greater than or equal to 25% of a thickness of the piezoelectric plate of the n shunt resonators.

19. The filter device of claim 15, wherein the at least one frequency setting dielectric layer comprises at least one of silicon dioxide, silicon nitride, aluminum oxide, aluminum nitride, beryllium oxide, tantalum oxide, and tungsten oxide.

20. The filter device of claim 15, wherein the at least one frequency setting dielectric layer comprises one or more of a layer disposed at or between the interleaved fingers, a layer disposed on a side of the piezoelectric plate that is opposite to a side at which the interleaved fingers are disposed, or any combination thereof.

* * * * *